United States Patent
Owczarz et al.

(10) Patent No.: US 7,128,803 B2
(45) Date of Patent: Oct. 31, 2006

(54) INTEGRATION OF SENSOR BASED METROLOGY INTO SEMICONDUCTOR PROCESSING TOOLS

(75) Inventors: Aleksander Owczarz, San Jose, CA (US); Yehiel Gotkis, Fremont, CA (US); Dave Hemker, San Jose, CA (US); Rodney Kistler, Los Gatos, CA (US)

(73) Assignee: Lam Research Corporation, Fremont, CA (US)

( * ) Notice: Subject to any disclaimer, the term of this patent is extended or adjusted under 35 U.S.C. 154(b) by 396 days.

(21) Appl. No.: 10/186,472

(22) Filed: Jun. 28, 2002

(65) Prior Publication Data

US 2005/0072528 A1 Apr. 7, 2005

(51) Int. Cl.
*C23F 1/00* (2006.01)
*H01L 21/306* (2006.01)

(52) U.S. Cl. ............ 156/345.13; 156/345.15; 156/345.24; 156/345.32; 118/712; 118/715; 118/719

(58) Field of Classification Search ............ 156/345.12, 156/345.13, 345.31, 345.32; 324/328–330; 118/712
See application file for complete search history.

(56) References Cited

U.S. PATENT DOCUMENTS

| | | | | |
|---|---|---|---|---|
| 2,057,835 A * | 10/1936 | Wolfgang et al. | ............ | 324/229 |
| 2,842,737 A * | 7/1958 | Zoltan | ............ | 324/229 |
| 3,815,016 A | 6/1974 | Nix et al. | ............ | 324/34 |
| 4,556,845 A | 12/1985 | Strope et al. | | |
| 4,757,259 A * | 7/1988 | Charpentier | ............ | 324/227 |
| 5,473,247 A | 12/1995 | You et al. | ............ | 324/227 |
| 5,485,082 A | 1/1996 | Wisspeintner et al. | ...... | 324/202 |
| 5,559,428 A | 9/1996 | Li et al. | | |
| 5,660,672 A | 8/1997 | Li et al. | ............ | 156/345 |
| 5,731,697 A | 3/1998 | Li et al. | | |
| 5,889,401 A | 3/1999 | Jourdain et al. | | |
| 5,926,020 A | 7/1999 | Samson | ............ | 324/238 |
| 6,072,313 A | 6/2000 | Li et al. | | |
| 6,132,289 A * | 10/2000 | Labunsky et al. | ............ | 451/6 |
| 6,265,870 B1 | 7/2001 | Weischedel | ............ | 324/240 |
| 6,291,992 B1 | 9/2001 | van Andel et al. | ............ | 324/240 |
| 6,350,179 B1 * | 2/2002 | Campbell et al. | ............ | 451/41 |
| 6,428,673 B1 * | 8/2002 | Ritzdorf et al. | ............ | 205/84 |
| 6,514,865 B1 * | 2/2003 | Evans | ............ | 438/710 |

(Continued)

FOREIGN PATENT DOCUMENTS

DE      1 452 417      10/1976      ............ 7/10

(Continued)

*Primary Examiner*—Karla Moore
(74) *Attorney, Agent, or Firm*—Martine Penilia & Gencarella, LLP

(57) ABSTRACT

A system for processing a wafer is provided. The system includes a chemical mechanical planarization (CMP) tool. The CMP tool includes a wafer carrier defined within a housing. A carrier film is affixed to the bottom surface and supports a wafer. A sensor embedded in the wafer carrier. The sensor is configured to induce an eddy current in the wafer to determine a proximity and a thickness of the wafer. A cluster of sensors external to the CMP tool is included. The cluster of sensors is in communication with the sensor embedded in the wafer carrier and substantially eliminates a distance sensitivity. The cluster of sensors provides an initial thickness of the wafer to allow for a calibration to be performed on the sensor embedded in the wafer carrier. The calibration offsets variables causing inaccuracies in the determination of the thickness of the wafer during CMP operation. A method and an apparatus are also provided.

11 Claims, 13 Drawing Sheets

U.S. PATENT DOCUMENTS

| | | | |
|---|---|---|---|
| 6,563,308 B1 | 5/2003 | Nagano et al. | 324/230 |
| 6,661,224 B1* | 12/2003 | Linder | 324/227 |
| 2001/0024691 A1* | 9/2001 | Kimura et al. | 427/346 |
| 2003/0071615 A1* | 4/2003 | Schlicker et al. | 324/242 |

FOREIGN PATENT DOCUMENTS

| | | | |
|---|---|---|---|
| DE | 422773 A1 * | 2/1994 | |
| EP | 0 370 691 | 5/1990 | 27/90 |
| EP | 0 459 441 | 5/1991 | 27/90 |

* cited by examiner

US 7,128,803 B2

INTEGRATION OF SENSOR BASED METROLOGY INTO SEMICONDUCTOR PROCESSING TOOLS

CROSS REFERENCE TO RELATED APPLICATION

This application is related to U.S. patent application Ser. No. 10/186,932, filed on the same day as the instant application and entitled "METHOD AND APPARATUS OF ARRAYED SENSORS FOR METROLOGICAL CONTROL." The disclosure of this related application is incorporated herein by reference.

BACKGROUND OF THE INVENTION

The invention relates generally to semiconductor fabrication and more specifically to in-line metrology for process control during wafer processing.

During semiconductor fabrication a there are multiple steps where an underlying substrate is subjected to the formation, modification and removal of various layers. The small feature sizes, tight surface planarity requirements, combined with the constant quest to increase throughput, makes it highly desirable to stop the process when the correct thickness has been achieved, i.e., when an endpoint has been obtained for the process step.

Eddy current sensors are used for displacement, proximity and film thickness measurements. The sensors rely on the induction of current in a sample by the fluctuating electromagnetic field of a test coil proximate to the object being measured. Fluctuating electromagnetic fields are created as a result of passing an alternating current through the coil. The fluctuating electromagnetic fields induce eddy currents which perturb the applied field and change the coils inductance.

FIG. 1 is a simplified schematic diagram of the principle upon which an eddy current sensor operates. An alternating current flows through coil 100 in close proximity to conducting object 102. The electromagnetic field of the coil induces eddy currents 104 in conducting object 102. The magnitude and the phase of the eddy currents in turn effect the loading on the coil. Thus, the impedance of the coil is impacted by the eddy currents. This impact is measured to sense the proximity of conducting object 102 as well as a thickness of the object. Distance 106 impacts the effect of eddy currents 104 on coil 100, therefore, if object 1002 moves, the signal from the sensor monitoring the impact of eddy currents on coil 100 will also change.

Attempts to use eddy current sensors to measure thickness of a film has resulted in limited success. Since the signal from the eddy current sensor is sensitive to both the thickness of the film and distance of the substrate to the sensor, there are two unknowns that must be resolved. FIG. 2 is a schematic diagram of a wafer carrier having an eddy current sensor for measuring the thickness of a wafer during a chemical mechanical planarization process (CMP). Wafer carrier 108 includes eddy current sensor 110. During a CMP operation, wafer 114 supported by carrier film 112 of carrier 108 is pressed against pad 116 to planarize a surface of the wafer. Pad 116 is supported by stainless steel backing 118.

One shortcoming of the configuration of FIG. 2 comes from the variability of the carrier film, which, being only 0.020" thick can undergo variations up to 0.006" from sample to sample. Process conditions, in particular, film compression due to wafer load, affect the sensor-metal layer distance. Thus, the carrier film and variable process conditions cause a substantial variability in the distance between the wafer and the sensor. Accordingly, it becomes extremely difficult to calibrate for all the variables that effect the distance, which in turn impacts the thickness measurement of the sensor. Another shortcoming of this configuration is caused by the presence of another conducting material separate from the conducting material being measured and is commonly referred to as a third body effect. If the thickness of the conductive layer is less than the so-called skin depth, the electromagnetic field from the coil will not be completely absorbed and will partially pass through to stainless steel backing 118 of pad 116 of FIG. 2. The electromagnetic field will induce additional eddy currents within the stainless steel belt, thereby contributing to the total signal from the eddy current sensor. Furthermore, it should be appreciated that the pad wears or erodes over time, causing variation in the distance between the stainless steel backing and the eddy current sensor, which influences the appropriated contribution to the total eddy current sensor signal. Thus, a wear factor has to be considered as the wafers are continuously being processed. Consequently, due to the variability injected into the thickness measurement, the amount of error is unacceptably high and unpredictable.

Additionally, in line metrology used for semiconductor processing properties is incorporated in most semiconductor manufacturing equipment and particularly with CMP tools. However, obtaining the required data takes time, which in some cases is as long as the wafer processing time for a particular fabrication step. Furthermore, the current approaches add stations to the processing systems resulting in an increased footprint for the systems as well as an extra travel pathway for the wafer.

In view of the foregoing, there is a need to provide a method and system to capture incoming wafer characteristics, such as thickness of the wafer and films deposited on the wafer, on the fly so that the characteristics can be used to process the wafer more accurately and more efficiently.

SUMMARY OF THE INVENTION

Broadly speaking, the present invention fills these needs by providing a sensor cluster or sensor array incorporated into the front end of a processing tool to generate a thickness profile of a semiconductor substrate prior to its processing by the tool. The sensor array or sensor cluster is incorporated into the system by combining it with existing motion actuating devices so as not to alter the footprint of the tool or the flow path of the wafer. In the most of the cases the existing motion actuating devices, like robotics, center aligners, notch detectors etc., are not designed to keep the wafer in the same plane during the process cycle. Therefore, a distance insensitive solution is provided herein.

In accordance with one embodiment of the present invention, a wafer aligner is provided. The wafer aligner includes a rotating support configured to support a semiconductor substrate. A cluster of sensors configured to detect a signal indicating a metal film thickness of the semiconductor substrate is included. The cluster of sensors includes sensors located at opposing sides of the semiconductor substrate. The cluster of sensors is configured to be substantially insensitive to a distance of the semiconductor substrate to the sensors located above and below the semiconductor substrate.

In another embodiment, a device for providing in-line metrology capabilities as a semiconductor substrate is being transported is provided. The device includes a transport mechanism configured to support the semiconductor substrate. A sensor cluster configured to detect a signal indicating a metal film thickness of the semiconductor substrate while the semiconductor substrate is being transported is included. The sensor cluster generates a thickness profile of the semiconductor substrate. The thickness profile is stored electronically. The sensor cluster is further configured to be substantially insensitive to a change in distance between the semiconductor substrate and corresponding sensors of the sensor cluster.

In accordance with yet another embodiment of the present invention, a system for processing a semiconductor substrate is provided. The system includes a load port configured to hold a semiconductor substrate and a robot arm configured to transport the semiconductor substrate. An aligner configured to receive the semiconductor substrate from the robot arm is included. The aligner includes a sensor cluster configured to detect a signal indicating a metal film thickness of the semiconductor substrate to generate a thickness profile of the semiconductor substrate. The sensor cluster includes sensors located at opposing sides of the semiconductor substrate. The sensor cluster is configured to be substantially insensitive to a distance of the semiconductor substrate to the sensors located above and below the semiconductor substrate. A controller is in communication with the sensor cluster, where the controller is configured to receive the thickness profile is included. A process tool sensor in communication with the sensor cluster through the controller is included. The process tool sensor is configured to receive the thickness profile from the controller to calibrate the process tool sensor. A recipe for a processing operation performed by a process tool containing the process tool sensor is configured to be modified in response to the thickness profile being received by the process tool sensor.

In still yet another embodiment, a method for mapping a thickness profile of a semiconductor substrate to allow for customized processing operations based upon the thickness profile is provided. The method initiates with selecting a wafer. Then, the selected semiconductor substrate is transported to a processing tool. The transporting includes rotating the semiconductor substrate. Next, a thickness profile of the semiconductor substrate is detected while the semiconductor substrate is rotating. Then, the thickness profile of the semiconductor substrate is provided to a controller associated with a process tool. In response to the thickness profile to the controller, a recipe associated with the process tool is adjusted for the thickness profile of the semiconductor substrate.

In another embodiment, a method for determining an endpoint thickness for a chemical mechanical planarization (CMP) operation is provided. The method initiates with providing a first sensor external to the CMP module. Then, a thickness of a wafer is detected by the first sensor. Next, the thickness of the wafer is supplied to a second sensor in the CMP module. Then, the second sensor is calibrated according to the thickness of the wafer. Next, CMP operating parameters are adjusted based on a signal from the second sensor in order to optimize a CMP operation for the wafer.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE PREFERRED EMBODIMENTS

Figure 1:
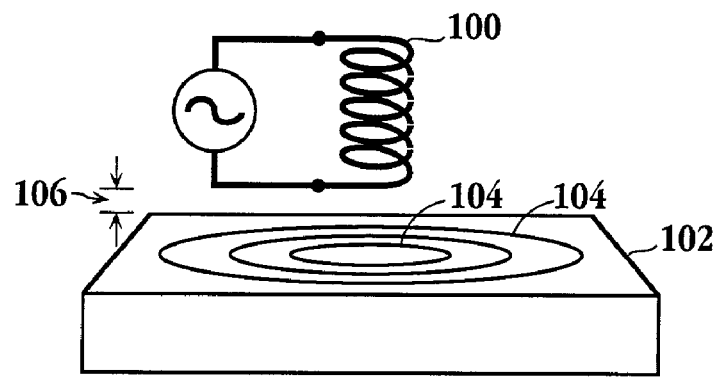
FIG. 1 is a simplified schematic diagram of the principle upon which an eddy current sensor operates.
Figure 2:
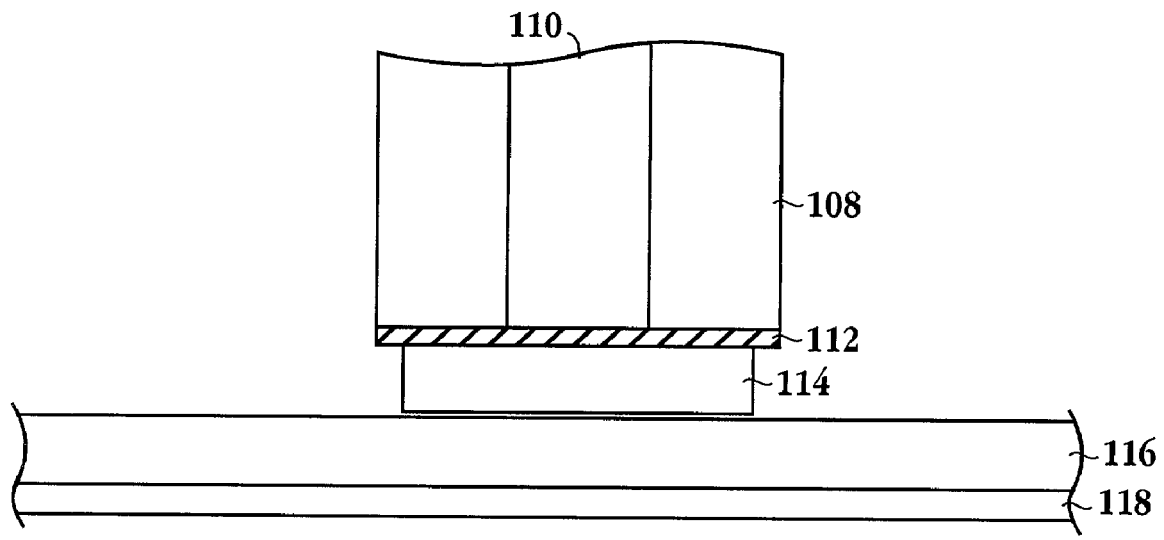
FIG. 2 is a schematic diagram of a wafer carrier having an eddy current sensor for measuring the thickness of a wafer during a chemical mechanical planarization process (CMP).

Several exemplary embodiments of the invention will now be described in detail with reference to the accompanying drawings. FIGS. 1 and 2 are discussed above in the "Background of the Invention" section.

Eddy current sensors (ECS) allow for measuring a metal film thickness of a moving wafer. It has been determined that ECS are capable of providing a fast enough response for a wafer moving under typical loading robotics velocity. Therefore, it is possible to perform the thickness measurements "on the fly" without impacting process throughput. Moreover, the movement of the wafer can be taken advantage of to produce a thickness profile from a limited number of sensors in a cluster configuration. For example, wafer aligners provide movement in a rotational direction and a linear radial direction. Accordingly, a cluster of sensors can capture a thickness profile of a wafer while the wafer is undergoing common automated wafer handling schemes. In one embodiment, a thickness profile can be generated for each wafer so that a recipe of a downstream process can be optimized for the thickness profile.

The Figures below initially provide configurations for an incoming sensor or sensor cluster that determines the thickness of a wafer under non-process conditions, i.e., non-disturbing conditions. This thickness can then be stored and/or communicated to downstream fabrication processes dealing with thin metal films. That is, the incoming thickness can be supplied to a similar thickness measuring device for the downstream fabrication process. The sensor associated with the downstream fabrication process can then be calibrated with the incoming thickness to make the unknowns or variables resulting from the processing conditions irrelevant. It should be appreciated that a cluster of sensors refers to the combination of two or three sensors to define a new metrological property. In one embodiment, the sensors are joined into clusters to remove sensitivity to distance. Sample results of data gathered with the sensor configurations are also provided herein. An array of sensors as used herein includes two or more clusters of sensors joined to cover, i.e., map, a larger area of a wafer. Additionally, three sensors located on the same side of a wafer can be considered an array.

When integrating the clustered sensor with a pre-existing station the thickness of the wafer can be mapped and stored for a downstream processing operation. In addition, when the wafers are removed from the processing chamber the thickness of the processed wafer can also be scanned to provide feedback as to the results of the processing operation. Accordingly, adjustments can be made to the recipe of the operation based on the feedback. Of course, the post processing results can be provided for further processing operations also.

Figure 3:
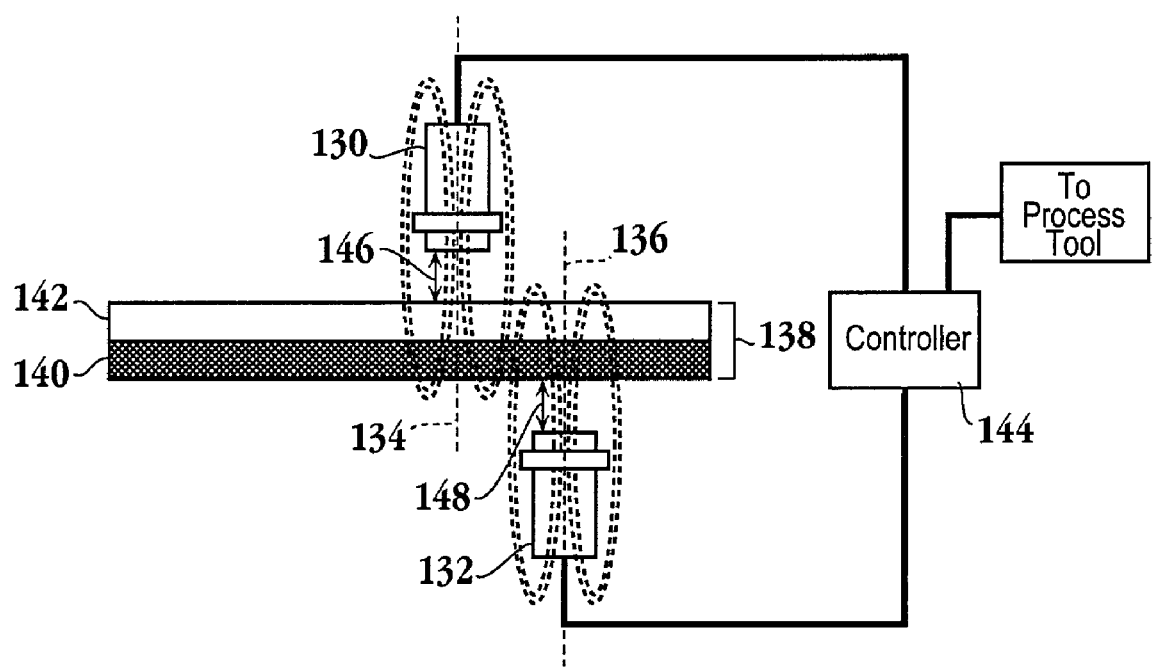
FIG. 3 is a simplified schematic diagram of coupled sensors for measuring thickness of an incoming wafer in accordance with one embodiment of the invention.

FIG. 3 is a simplified schematic diagram of coupled sensors for measuring thickness of an incoming wafer in accordance with one embodiment of the invention. Top sensor 130 and bottom sensor 132 are configured to provide a signal indicating a thickness of wafer 138. In one embodiment, sensors 130 and 132 are eddy current sensors. Wafer 138 includes substrate 142 and metal layer 140. Axis 134 of top sensor is offset from axis 136 of bottom sensor 132. One skilled in the art will appreciate that by offsetting top sensor 130 and bottom sensor 132, where both sensors are eddy current sensors, the electromagnetic field produced by sensors 130 and 132 will not interfere, i.e., suppress each other. Where the frequencies are the same and axis 134 is aligned with axis 136 then suppression of the signals can occur in certain situations, however, as will be explained below adjustments can be made to avoid suppression of the signals. Controller 144 is in communication with sensors 132 and 134. In one embodiment, controller 144 is configured to receive signals from sensors 132 and 134 and determine a thickness of wafer 138. It should be appreciated that controller 144 averages the signals from sensor 130 and 132 to arrive at a signal indicating a thickness of the wafer. Furthermore, by providing top sensor 130 and bottom sensor 132 a change in distance 146 between the top sensor and a top surface of wafer 138 or a change in distance 148 between the bottom sensor and a bottom surface of wafer 138 are cancelled out. That is, a change in either distance when both the sensors are stationary is offset by the averaging of the readings so that the signal is now a function of thickness rather than thickness and proximity. In another embodiment, controller 144 communicates the calculated thickness to a downstream tool, such as a CMP tool, so that the downstream process can optimize the process settings, such as pressure of the down force applied and belt speed, based upon the incoming thickness of the wafer.

Figure 4:
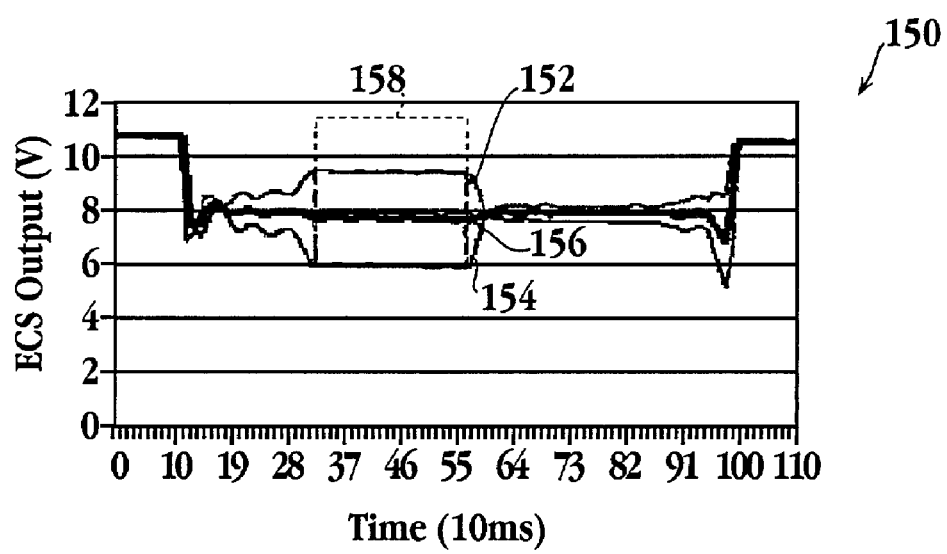
FIG. 4 is a graph of the signal of coupled eddy current sensors configured as in FIG. 3 in accordance with one embodiment of the invention.

FIG. 4 is a graph of the signal from coupled eddy current sensors configured as in FIG. 3 in accordance with one embodiment of the invention. Graph 150 plots an eddy current sensor output in volts versus time. Line 152 represents the signal from a sensor located below a wafer such as bottom sensor 132 of FIG. 3. Line 154 represents the signal from a sensor located above the wafer such as top sensor 130 of FIG. 3. Bold line 156 represents the average of lines 152 and 154. It will be apparent to one skilled in the art that line 156 provides a substantially constant signal. That is, by combining a signal from the top sensor with a signal from a bottom sensor, the dependence of the signal on the distance of the sensor is eliminated. For example, as wafer 138 of FIG. 3 moves closer to top sensor 130, the signal increases. Region 158 exemplifies the movement of the wafer closer to the top sensor. Thus, the signal intensity from the top sensor increases accordingly as illustrated by line 152 in region 158. At the same time, the wafer is moving away from the bottom sensor. Therefore, the signal intensity from the bottom sensor decreases similar to the increase of the signal intensity from the top sensor, as illustrated by line 154 in region 158. Consequently, an average of the top and bottom signal intensity stays constant. Since the signal intensity is linearly related to the distance of the sensor to the object, a change in signal intensity caused by movement of the object toward a first stationary sensor is offset by an opposite change in intensity caused by movement of the object away from a second stationary sensor. In turn, the sensitivity of the signal intensity to distance is eliminated.

Thus, by clustering a sensor or clusters of sensors with a sensor operating under working conditions, such as a sensor embedded in a wafer carrier of a CMP tool, the sensor operating under working conditions can be calibrated to more accurately provide information regarding the removal rate and process endpoint. That is, an accurate measurement of an incoming film thickness or wafer thickness is provided so that inaccuracies caused under processing conditions can be compensated through a calibration setting. Furthermore, the sensor cluster can be utilized as a run-to-run process control where a wafer has a thickness profile that is mapped by a first sensor or cluster of sensors and the profile is downloaded into a controller of the process tool to customize the process, such as a CMP process, to remove the correct amount of film thickness.

Figure 5:
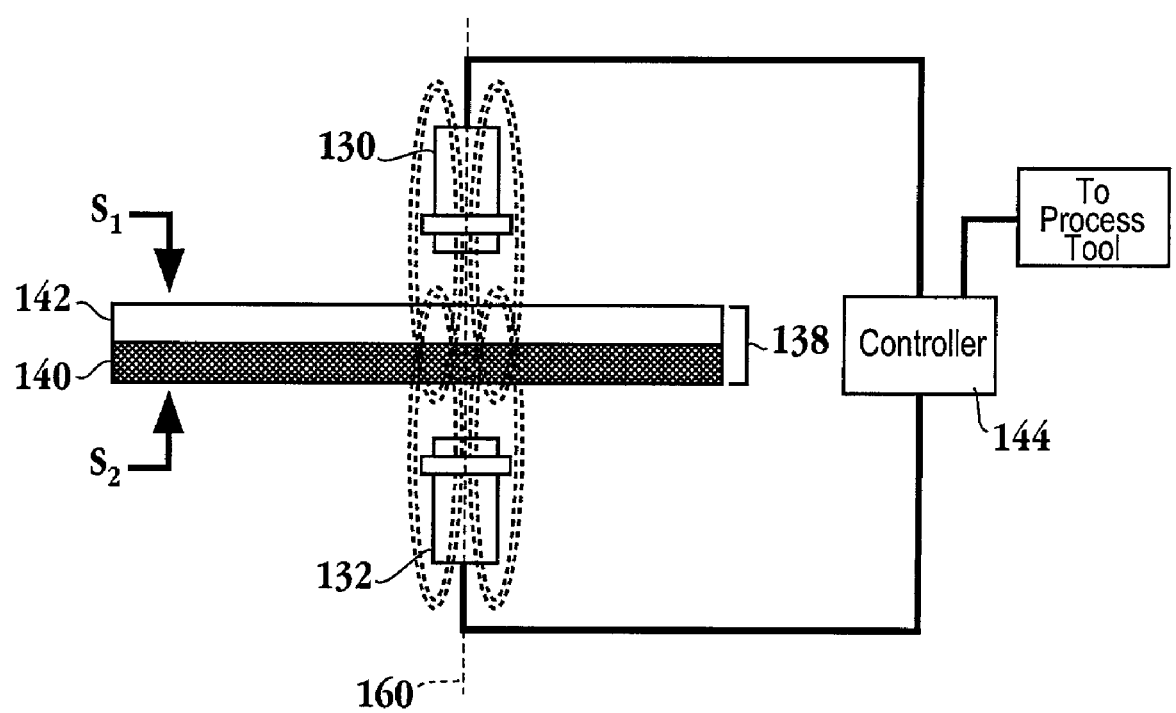
FIG. 5 is a simplified schematic diagram of an alternative configuration of coupled sensors for measuring an incoming thickness of a wafer or film in accordance with one embodiment of the invention.

FIG. 5 is a simplified schematic diagram of an alternative configuration of coupled sensors for measuring an incoming thickness of a wafer or film in accordance with one embodiment of the invention. Here, top sensor 130 and bottom sensor 132 share the same vertical axis 160. In order to eliminate any interference or suppression of the signals between the top and bottom sensors a different frequency can be applied for each of the respective sensors. Additionally, a phase shift can be applied so that the two sensors are out of phase. That is, one sensor overturns a wave of the signal by 180 degrees to eliminate suppression of the signal. Since distance is eliminated as a variable here as described above, the signal intensity is a function of thickness. Stated as a mathematical equation: $S=k(THK)$, where S is the signal intensity, k is the sensitivity coefficient and THK is the thickness. Where the signal intensity and the sensitivity coefficient are known for the above equation, the thickness can be determined through a calibration curve, in one embodiment. This determined thickness can be supplied to a downstream process tool dealing with thin metal films in a semiconductor fabrication process, such as a CMP tool as discussed with reference to FIGS. 8 and 9.

Figure 6A:
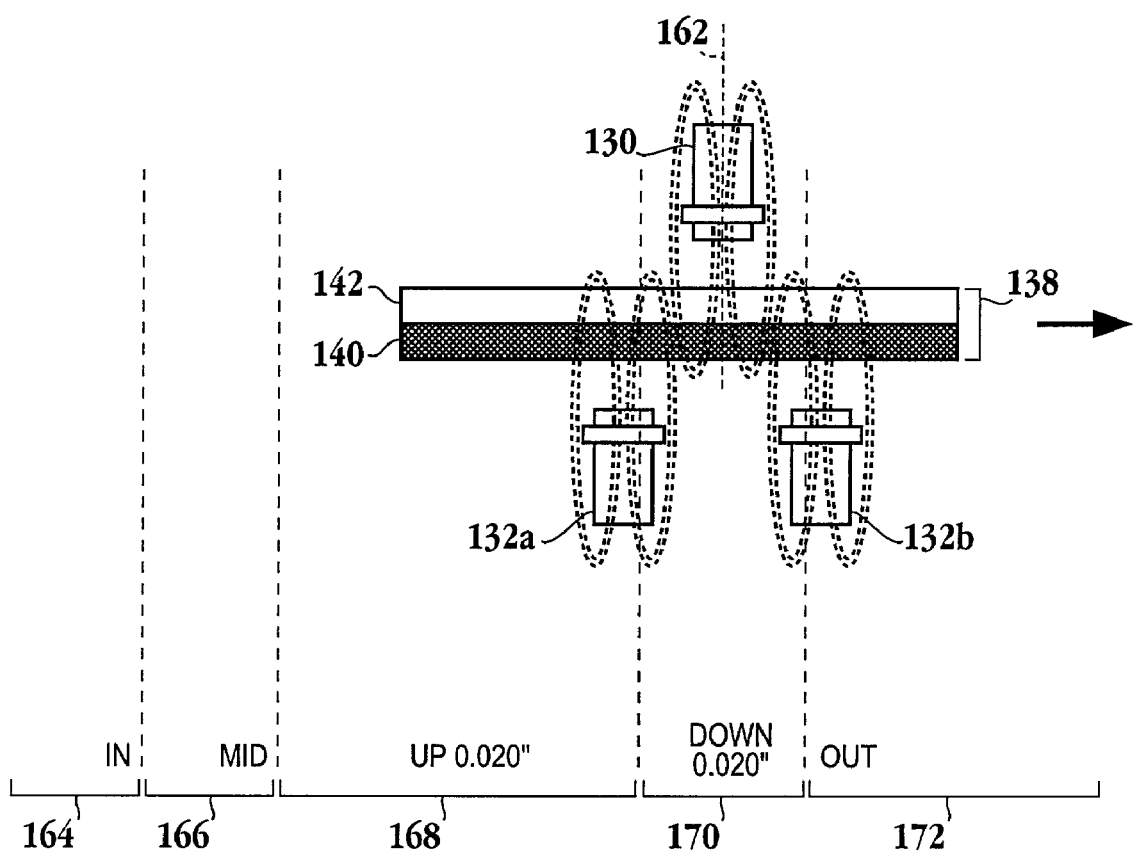
FIG. 6A is a simplified schematic diagram of another alternative configuration of coupled sensors for measuring thickness of an incoming wafer in accordance with one embodiment of the invention.

FIG. 6A is a simplified schematic diagram of another alternative configuration of coupled sensors for measuring thickness of an incoming wafer in accordance with one embodiment of the invention. In this embodiment, the sensor cluster is configured to determine the thickness of wafer 138 along axis 162 of top sensor 130. Bottom sensors 132a and 132b are positioned such that a distance from each sensor to axis 162 is the same. Thus, by averaging the signals from sensors 132a and 132b, the signal, and consequently the thickness, along axis 162 is determined. Here, interference or suppression of the signals between the top and bottom sensors is not a concern as bottom sensors 132a and 132b are offset from an axis of top sensor 130. Regions 164, 166, 168, 170 and 172 denote movement of wafer 138 as the wafer passes through a space defined between top sensor 130 and bottom sensors 132a and 132b. The significance of these regions are described in greater detail with reference to FIG. 6B.

Figure 6B:
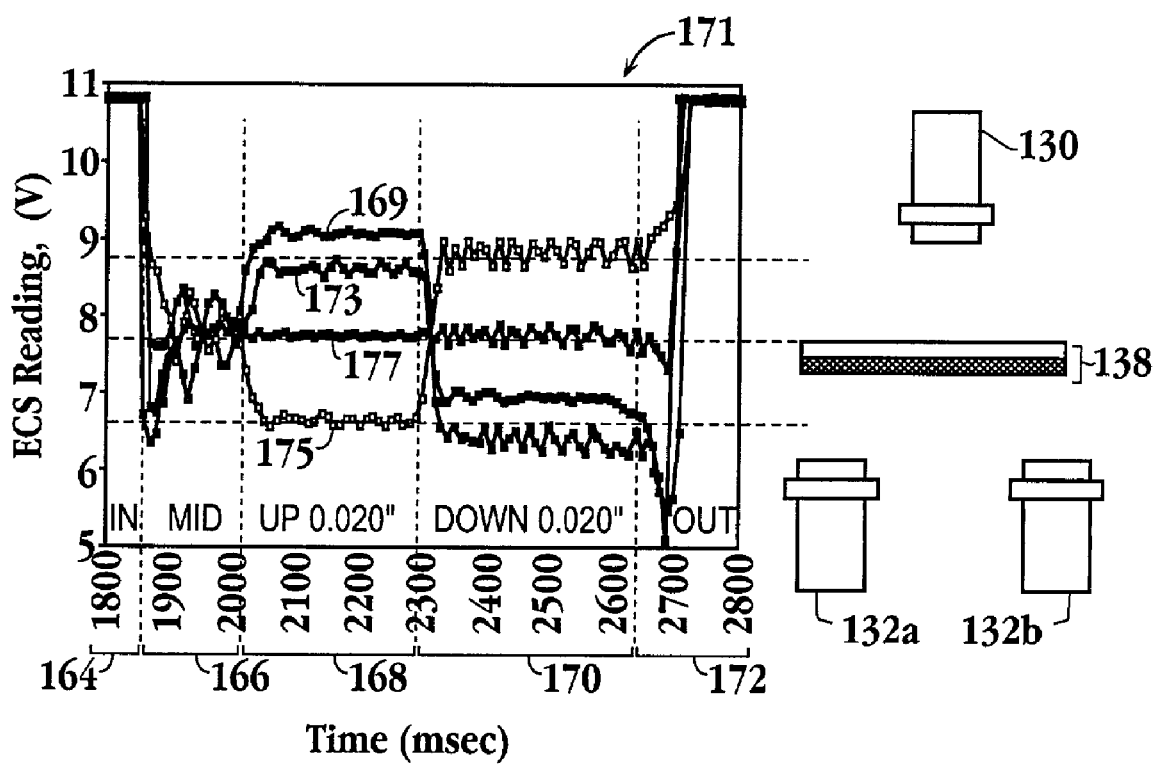
FIG. 6B is a graph illustrating the stability of an average signal when using an eddy current sensor cluster as configured to the side of the graph for detecting a film thickness in accordance with one embodiment of the invention.

FIG. 6B is a graph illustrating the stability of an average signal when using an eddy current sensor cluster as configured to the side of the graph for detecting a film thickness in accordance with one embodiment of the invention. In this configuration, eddy current sensor cluster includes a top sensor 130 and two bottom sensors 132a and 132b. Wafer 138 travels between top sensor 130 and bottom sensors 132a and 132b. Graph 171 plots the ECS readings in volts versus the time in milliseconds. Line 169 represents the reading from sensor 132a, while line 173 represents the reading from sensor 132b. Line 175 represents the reading from top sensor 130. In one embodiment, the signals from sensors 132a and 132b are averaged. This result is then averaged with the signal from sensor 130. The final averaged signal is represented by line 177. Graph 171 illustrates the various positions of wafer 138 as it passes through the sensor cluster. For example, wafer 138 comes into the sensor cluster and is represented on the graph by region 164. It should be appreciated that the ECS reading of 11 volts represents a starting point corresponding to a thickness of 0 as the wafer is not being measured here. The signals stabilize as the wafer edge passes through the sensor cluster. Then, the wafer continues along this midpoint travel path as represented in region 166. As can be seen, the average reading represented by line 177 stays relatively steady.

Next, the wafer is moved up by 0.020 inches. While the signal intensity, i.e., a difference between the measured signal and the reference signal at 0 thickness, from top sensor 130 becomes stronger, the signal intensity from bottom sensors 132a and 132b becomes weaker. However, the average represented by line 177 remains relatively constant. The wafer is then moved down 0.020 inches from the midpoint path. Accordingly, the signal intensity from top sensor 130 becomes weaker, while the signal intensity from bottom sensors 132a and 132b becomes stronger. As above, the average of the top sensor signal and the bottom sensor signal remains relatively constant. Thus, as mentioned above, the sensor cluster supplies a stable signal where the distance of the wafer from the sensor is irrelevant as the average of a top and bottom signal offsets variability from the wafer moving or even variation of the signal from wafer warping. Wafer 138 then moves out of the sensor cluster as depicted in region 172 where the signals vary as the sensors see the edge of the wafer upon exit. It should be appreciated that regions 164–172 of FIG. 6A represent a similar pattern of movement as described with respect to FIG. 6B. A graph of the movement of FIG. 6A would yield a substantially constant average signal as in FIG. 6B. One skilled in the art will appreciate that the sensors can be configured with one bottom sensor and one top sensor, one bottom sensor and two bottom sensors, or any other suitable configuration to offset the movement of the wafer so that a stable reading is maintained.

Figure 7A:
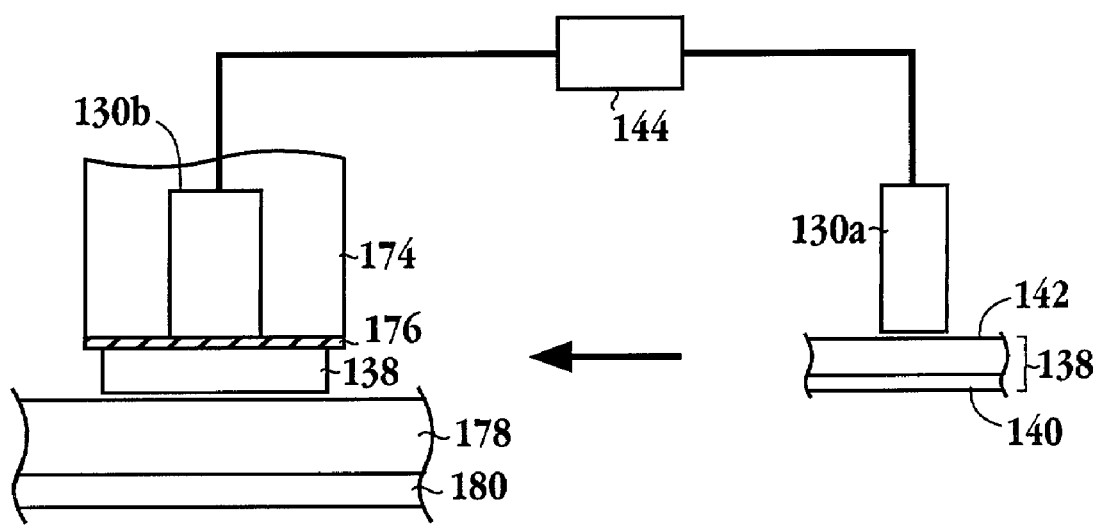
FIG. 7A is a simplified schematic diagram of an incoming thickness sensor coupled to a downstream CMP process thickness sensor in accordance with one embodiment of the invention.

FIG. 7A is a simplified schematic diagram of an incoming thickness sensor coupled to a downstream CMP process thickness sensor in accordance with one embodiment of the invention. Here, incoming thickness sensor 130a determines a thickness of the wafer and/or thin film 140 over substrate 142 of wafer 138. The signal indicating the determined thickness is communicated to controller 144. In turn, controller 144 communicates the signal to sensor 130b, which is embedded in wafer carrier 174 for a CMP process. In one embodiment sensors 130a and 130b are eddy current sensors. In another embodiment, sensors 130a and 130b are infrared sensors. It should be appreciated that by providing sensor 130b with the thickness of incoming wafer 138, a calibration can be performed to substantially eliminate the sensitivity to the distance between the sensor and the wafer. The variability in the distance between sensor 130b and wafer 138 can be caused by carrier film 176 compressing during working conditions or just due to the inherent variation of the thickness of the carrier film, which can be as great as +/−3 millimeters. Additionally, the distance between the top of polishing pad 178 and stainless steel backing 180 impacts the signal from sensor 130b. Again, the signal indicating the thickness of incoming wafer 138 can be used to calibrate sensor 130b to substantially eliminate variability caused by polishing pad tolerances and pad erosion that impact the distance between the top of polishing pad 178 and stainless steel backing 180.

Figure 7B:
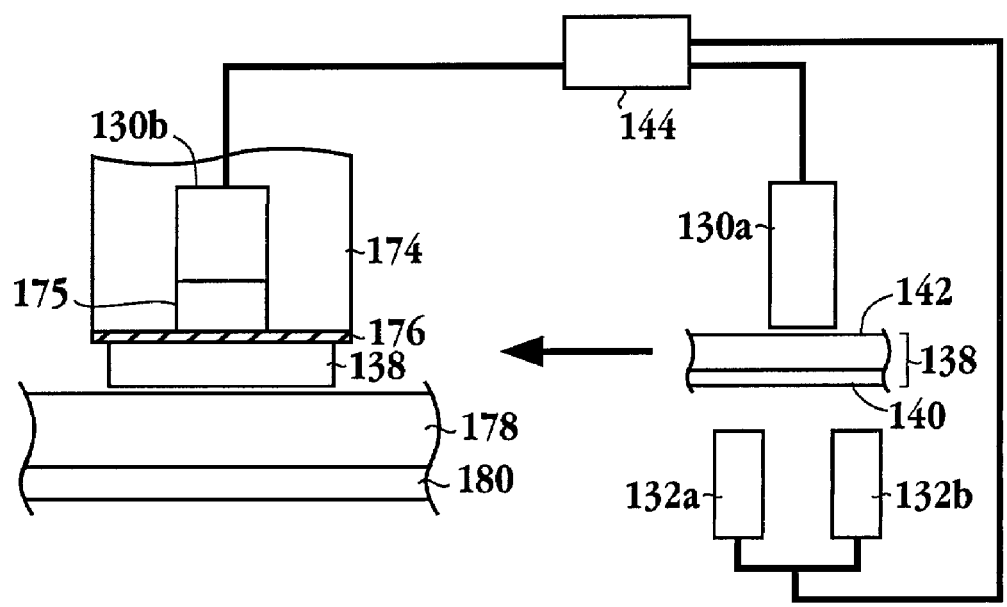
FIG. 7B is a simplified schematic diagram of an alternative embodiment of an incoming thickness sensor coupled to a downstream CMP process thickness sensor.

FIG. 7B is a simplified schematic diagram of an alternative embodiment of an incoming thickness sensor coupled to a downstream CMP process thickness sensor. In FIG. 7B, a sensor cluster consisting of top sensor 130a and bottom sensors 132a and 132b, is in communication with controller 144. Here, a suitable sensor cluster, such as the sensor cluster of FIGS. 6A and 6B, is provided to determine the incoming thickness of wafer 138 or of thin film 140 of the wafer. One skilled in the art will appreciate that the sensor cluster with reference to FIGS. 3 and 5 are suitable sensor clusters that can also be used to determine the thickness of wafer 138. In one embodiment, controller 144 averages the signal from bottom sensors 132a and 132b in order to determine a thickness signal for the thickness of wafer 138 along an axis of top sensor 130a through the wafer. The averaged signal of the bottom sensors is then averaged with the signal from top sensor 130a to determine a thickness of wafer 138 or thin film 140. This thickness is then communicated to embedded sensor 130b. As mentioned above with reference to FIG. 7A, an auto calibration can be performed for sensor 130b where the sensitivity to the distance between the sensor and wafer 138 and the sensitivity to the distance between the top of polishing pad 178 and stainless steel backing 180 are substantially eliminated. That is, the auto calibration can be performed in real-time to adjust the ECS readout for variation in sensor proximity due to pad-wear or other mechanical drift issues with the CMP carrier-to-plates mechanical displacements.

Sensor 130b of FIG. 7B is disposed over spacer 175. Spacer 175 is aligned with the bottom surface of wafer carrier 174. Spacer 175 is composed of any suitable material that is non-conductive. In one embodiment, spacer 175 is a polymer. In another embodiment, spacer 175 is between about 1 millimeter (mm) and about 1.5 mm thick. It should be appreciated that spacer 175 provides a window for sensor 130b to transmit and receive signals indicating the thickness and proximity of a wafer or film on a wafer.

While the embodiments of FIGS. 7A and 7B illustrate a sensor or sensor cluster for pre-CMP processing, a sensor or sensor cluster can also be located post CMP processing to provided information configured to improve run-to-run process control. While the incoming thickness allows for specific recipes to be downloaded to the process tool station to compensate for any incoming film thickness, the post CMP thickness allows for the correction of any detected process variation determined in the post-CMP thickness uniformity measurement. That is, the post-CMP thickness uniformity measurement is provided as feedback to sensor 130b, in order for sensor 130b to further fine tune the calibration settings to obtain an accurate endpoint. In one embodiment, controller 144 provides the feedback to sensor 130b from a post-CMP sensor cluster. In another embodiment, the eddy current sensors are commonly available eddy current sensors, such as GP-A series analog displacement sensors available from SUNX Limited. In another embodiment, multiple sensors can be placed in the wafer carrier of FIGS. 7A and 7B. The multiple sensors can be linked together to detect both wafer proximity and metal film-thickness. For example, a capacitance sensor can be included in the wafer carrier to determine a distance between the wafer and the ECS sensor. As the capacitance sensor is linked to the ECS sensor, the distance can be provided to the ECS sensor.

Figure 8A:
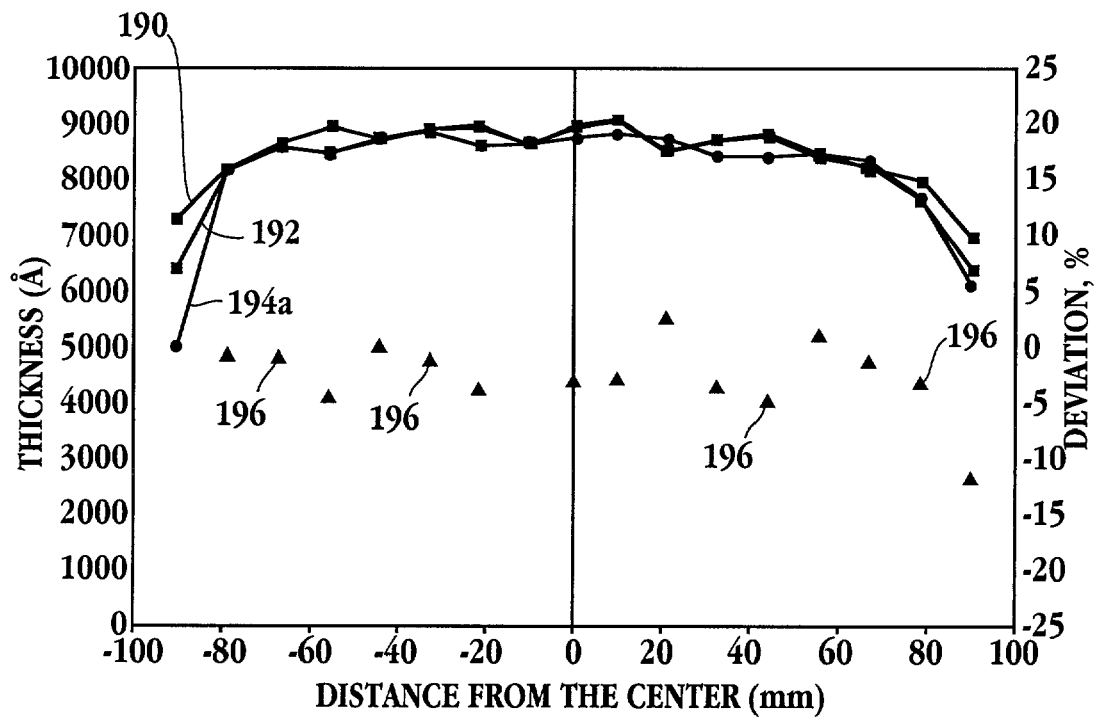
FIGS. 8A and 8B are graphs illustrating the correlation between the signal from an eddy current sensor for a film thickness and a signal from a standard resistivity film thickness measurement device in accordance with one embodiment of the invention
Figure 8B:
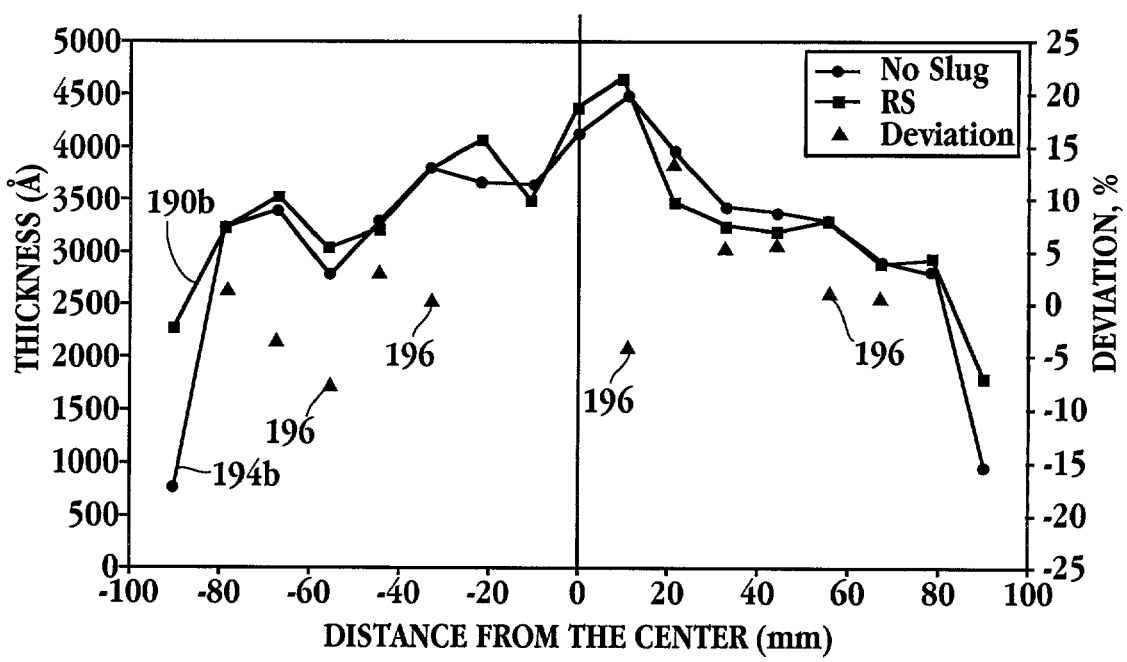

FIGS. 8A and 8B are graphs illustrating the correlation between the signal from an eddy current sensor for a film thickness and a signal from a standard resistivity film thickness measurement device in accordance with one embodiment of the invention. Line 190 of FIG. 8A represents the signal from a typical resistance sensor approach. Line 192 represents the signal from an eddy current sensor in the presence of a third metal body, such as the stainless steel backing of a polishing pad or belt, a wafer carrier, an air bearing platen, etc, of a CMP tool, at different points from the center of the wafer. Line 194a represents the signal from an eddy current sensor without the presence of a third metal body. Thus, the eddy current sensor closely correlates with the signals from a standard four point approach of the resistance measurement. Additionally, the percent deviation is within +/−5%, as illustrated by triangles 196, where each of the triangles corresponds to a difference between respective points on the lines above each of the triangles.

FIG. 8B similarly illustrates eddy current sensor measurements correlated to signals from a typical resistance sensor approach. Here, line 190b represents the signal from a typical resistance sensor approach, while 194b represents the signal from an eddy current sensor without the presence of a third metal body. It should be appreciated that the wafer measured in FIG. 8A is different than the wafer measure in FIG. 8B. Again the ECS signal 194b closely correlates with the RS75 signal. That is, the percent deviation between the signals is generally within +/−5% as illustrated by triangles 196. One skilled in the art will appreciate that the points at the ends of the lines correspond to the edge of the film, i.e., edge of the wafer, and are not considered as relevant.

Figure 9:
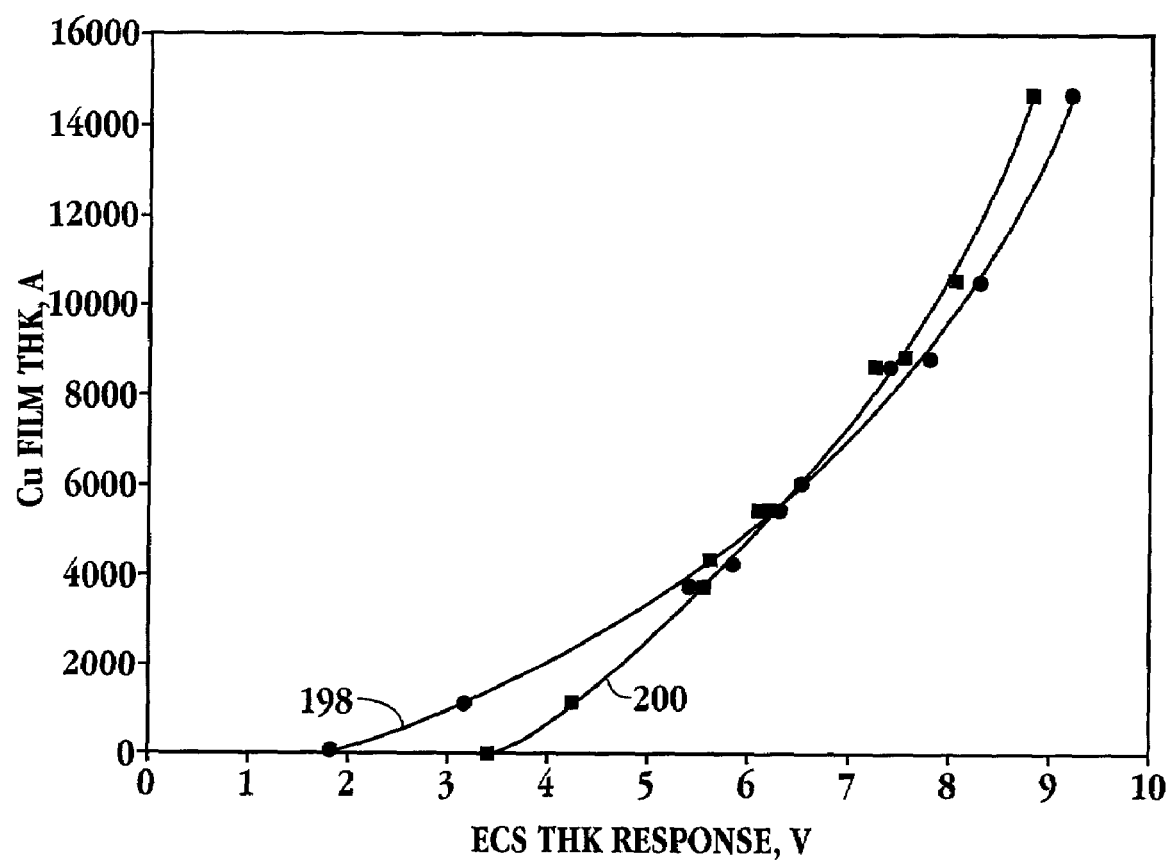
FIG. 9 is a graph illustrating a calibration curve for an eddy current sensor for measuring a copper film thickness in accordance with one embodiment of the invention.

FIG. 9 is a graph illustrating a calibration curve for an eddy current sensor for measuring a copper film thickness in accordance with one embodiment of the invention. Line 198 represents a film thickness of copper and the associated ECS voltage reading for that thickness without the presence of a third metal body. Line 200 represents a film thickness of copper and the associated ECS voltage reading for that thickness in the presence of a third metal body. One skilled in the art will appreciate that the calibration curves can be applied to the sensors described above with reference to FIGS. 3, 5, 6A, 6B, 7A and 7B. Additionally, calibration curves can be generated for any conductive film layer, as copper is described here for illustrative purposes only and not meant to be limiting.

Figure 10:
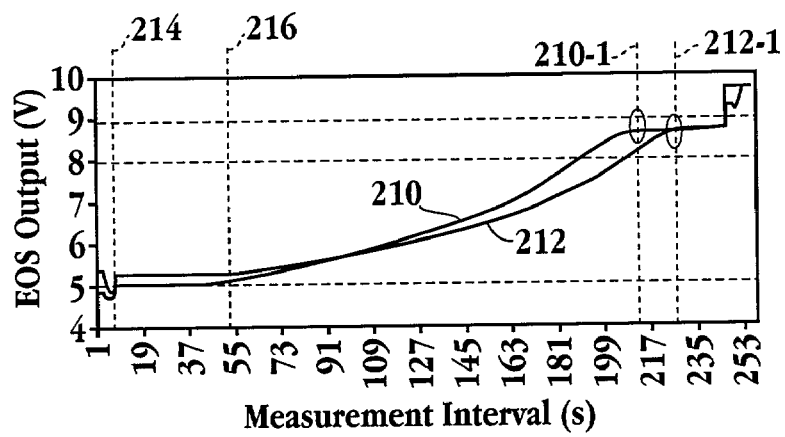
FIG. 10 is a graph illustrating two eddy current sensor output signals during a CMP operation of a copper thin film on a substrate in accordance with one embodiment of the invention.

FIG. 10 is a graph illustrating two eddy current sensor output signals during a CMP operation of a copper thin film on a substrate in accordance with one embodiment of the invention. Line 210 represents the ECS signal over time of the leading edge of the wafer undergoing the CMP operation. Line 212 represents the ECS signal over time of the trailing edge of the wafer undergoing the CMP operation. It should be appreciated that the region defined between line 214 and 216 removes the topography of the wafer, while the region after line 216 removes the copper overburden from the wafer. Point 210-1 represents the endpoint, i.e., clearing of the copper overburden, of the leading edge of the wafer. Point 212-1 represents the endpoint of the trailing edge of the wafer. One skilled in the art will appreciate that the information gathered from the ECS embedded in the wafer carrier will yield continuous data for determining a removal rate. Additionally, the removal rate variation between the leading edge and the trailing edge can be observed. Where the sensor is embedded in the wafer carrier, the sensor provides continuous real time data as to the thickness of the wafer or a film on the wafer being measured. That is, there is not a window where the sensor takes a snapshot once per revolution of a polishing belt or pad which provides discrete measurements. The embodiments described herein provide continuous measurement and thickness monitoring.

Figure 11A:
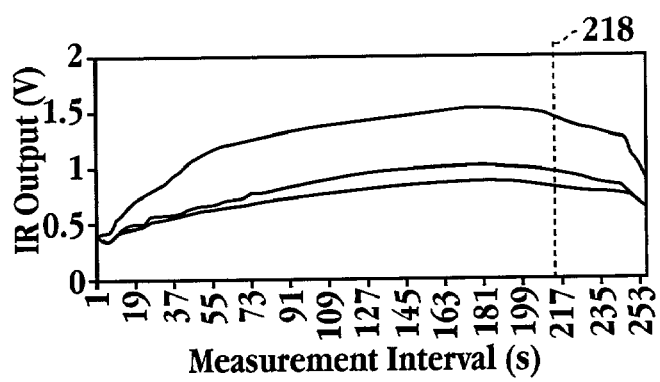
FIG. 11A is a graph of an Infrared (IR) sensor signal measuring the temperature of a polishing belt over time in accordance with one embodiment of the invention.

FIG. 11A is a graph of an infrared (IR) sensor signal measuring the temperature of a polishing belt over time in accordance with one embodiment of the invention. One skilled in the art will appreciate that a silicon substrate is transparent to the infrared signal, therefore, the infrared signal can detect the temperature of the thin film of the wafer being planarized by the surface of the polishing surface. The lines of the graph of FIG. 11A represent the monitoring of the infrared signal at various locations of the belt, such as the center front and back of the belt relative to an operator.

Figure 11B:
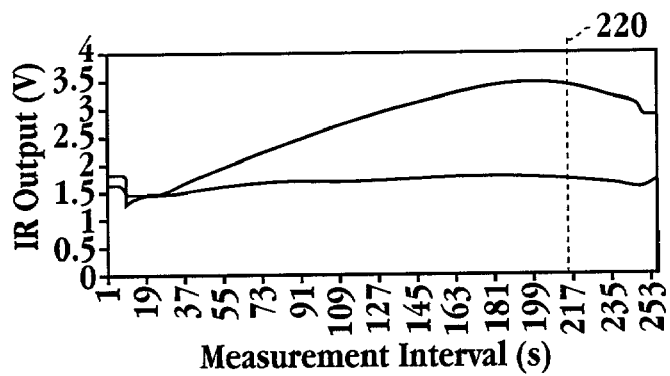
FIG. 11B is a graph of an Infrared signal of the wafer temperature over time in accordance with one embodiment of the invention.

FIG. 11B is a graph of an infrared signal of the wafer temperature over time in accordance with one embodiment of the invention. Here, the wafer temperature is being monitored to monitor temperature variation during CMP process flow. For each of the embodiments of FIGS. 11A and 11B, line 218 and 220, respectively, intersect the response lines of the graphs at the endpoint of the associated processes. That is, the belt temperature and wafer temperature begin to decrease at the endpoint, which is at an inflection point of the curves. In one embodiment, the wafer temperature changes by about 20 degrees Celsius and the belt temperature changes by about 10 degrees Celsius during the processing.

Figure 12:
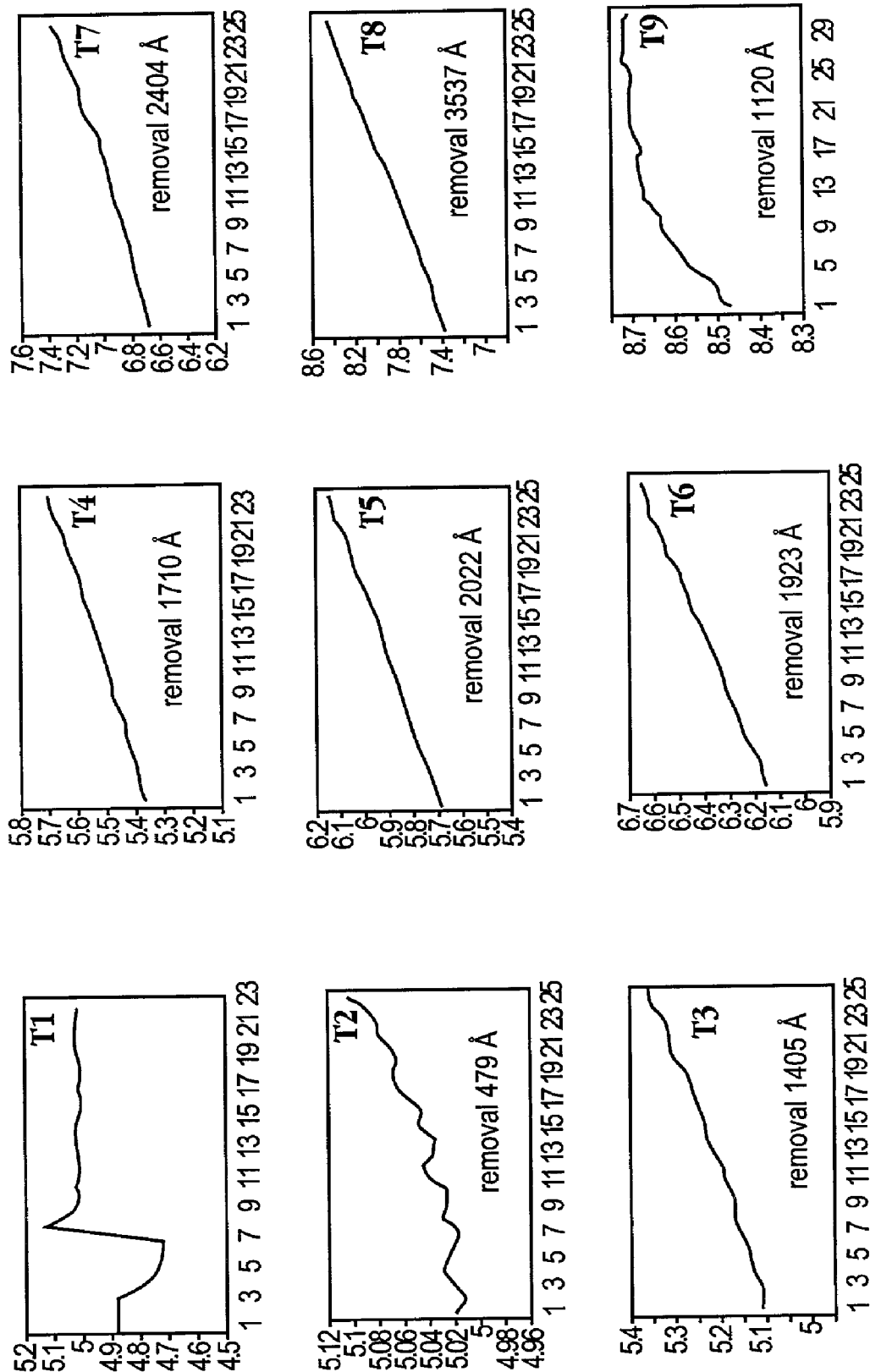
FIG. 12 is a schematic diagram of 30 second time sequences T1–T9 of a CMP process illustrating the removal of a copper film as measured by an eddy current sensor in the wafer carrier in accordance with one embodiment of the invention.

FIG. 12 is a schematic diagram of 30 second time sequences T1–T9 of a CMP process illustrating the removal of a copper film as measured by an eddy current sensor in the wafer carrier in accordance with one embodiment of the invention. Each of time sequences T1–T9 show the ECS signal on the y axis in volts and the time interval in seconds on the x axis. Time sequence T1 illustrates the initiation of the process, while time sequence T2 illustrates the beginning of the removal of the copper film. That is, 479 Å of material is removed in time sequence T2. Time sequences T3–T8 illustrate approximate 30 second periods and the associated amount of material removed during the time sequence. Time sequence T9 illustrates the occurrence of the endpoint condition.

Figure 13:
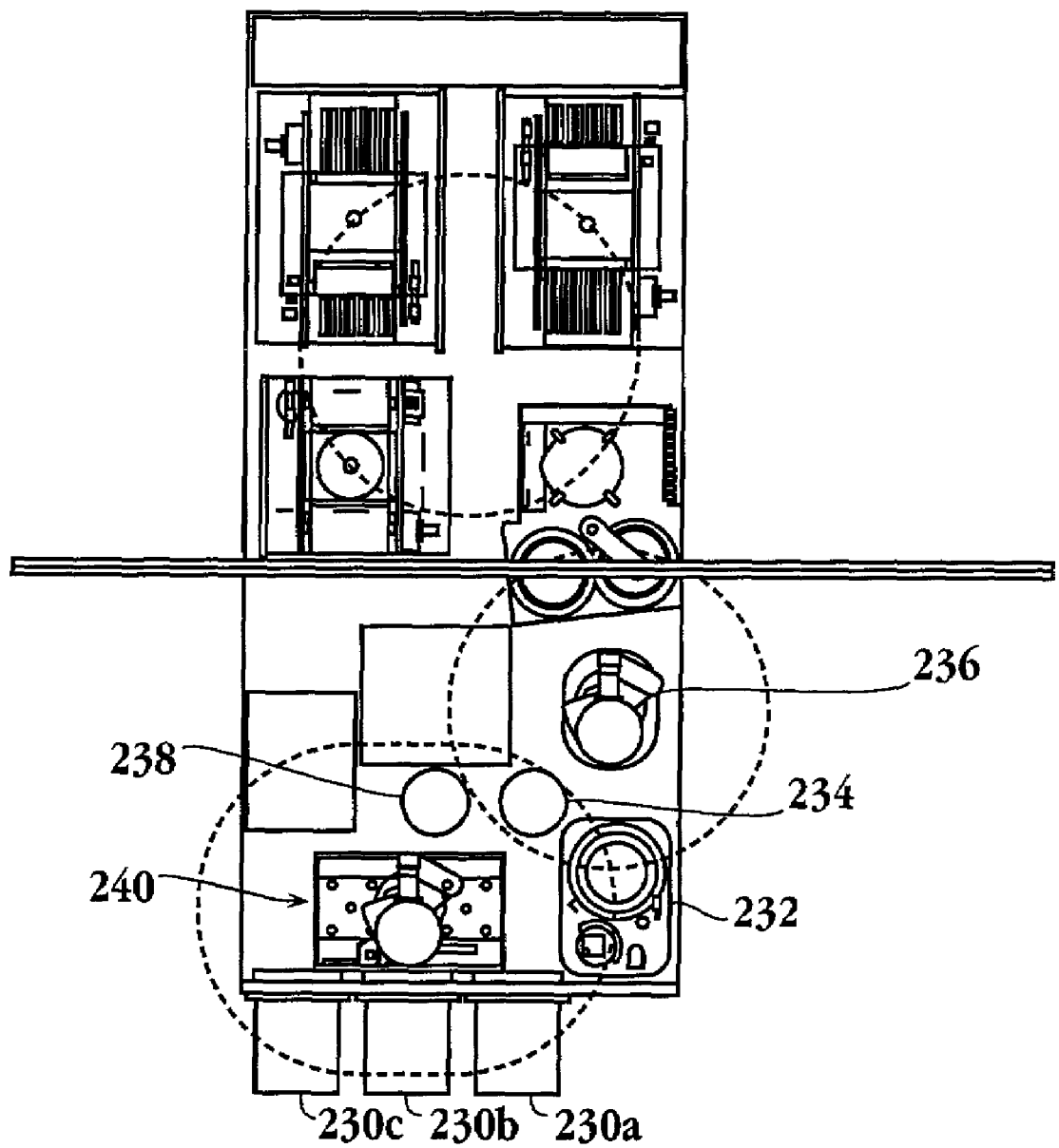
FIG. 13 is a high level schematic of a CMP system in accordance with one embodiment of the invention.

FIG. 13 is a high level schematic of a CMP system in accordance with one embodiment of the invention. As will be described below, the sensor cluster or array of sensor clusters can be incorporated into the front end of the CMP processing system to provided a thickness profile of the wafers as they are delivered to the processing module or received from the processing module. Load port modules 230a, 230b, and 230c contain wafers to be processed and/or wafers that have been processed. Robot 240 is configured to access load port modules 230a–c to transport the wafers to another station, such as dry buffer 208 or aligner 234. Robot 236 transports the wafer to and from the CMP processing module. Region 232 represents a spin, rinse and dry (SRD) module. It should be appreciated that a suitable sensor cluster, such as the sensor clusters discussed with reference to FIGS. 7A and 7B, can be integrated within the front end system of FIG. 13 in one embodiment. For example, the sensor cluster or even an array of sensor clusters can be integrated with aligner 234. Accordingly, as aligner 234 rotates the wafer, the thickness profile can be detected by the sensor cluster. Thus, no additional space is required, i.e., the footprint of the system is not affected, and the pathway of the wafer is not altered to obtain the information. While the sensor cluster is discussed with respect to a CMP tool, it should be appreciated that the sensor clusters can be incorporated with any tools dealing with thin metal films and using wafer aligners. Furthermore, a single sensor cluster can be incorporated into the embodiments described herein, or alternatively, an array of sensor clusters can be incorporated to cover a larger area for a more complete thickness profile of a wafer.

Figure 14:
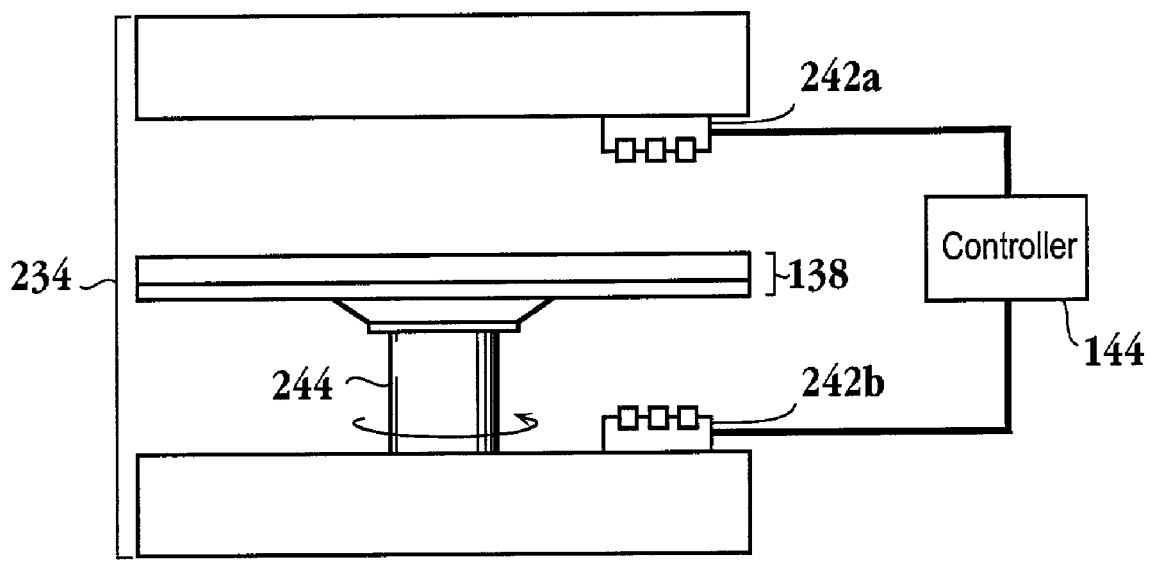
FIG. 14 is a cross sectional view of a simplified schematic of a wafer aligner with an integrated sensor cluster in accordance with one embodiment of the invention.

FIG. 14 is a cross sectional view of a simplified schematic of a wafer aligner with an integrated sensor cluster in accordance with one embodiment of the invention. Wafer aligner 234 includes spindle 244 that is configured to rotate wafer 138. In one embodiment, wafer 138 is held to spindle 244 through suction applied to a bottom surface of the wafer. Top sensor array 242a and bottom sensor array 242b each include a plurality of clustered sensors in each array. The clustered sensors of each array are configured to detect a signal indicating the thickness of a metal film on wafer 138. One suitable sensor cluster is an eddy current sensor cluster as described above with reference to FIGS. 6B and 7B. Top sensor array 242a is affixed to a top portion of aligner 234, while bottom sensor array is affixed to a bottom portion of the aligner. It should be appreciated that while top sensor array 242a and bottom sensor array 242b are illustrated as being offset from a center of the wafer, however, the sensor array and the sensor clusters making up the sensor array, can be positioned in any number of suitable locations over the wafer. In one embodiment, the sensor clusters included in top sensor array 242a and bottom sensor array 242b are offset between top and bottom sensors of a cluster such as with reference to FIGS. 3, 6A and 6B. In another embodiment, an axis of a top sensor of a sensor cluster in top array 242a is the same as an axis of a corresponding bottom sensor as discussed with reference to FIG. 5.

Each of the sensor clusters of the arrays of FIG. 14 are in communication with controller 144. As mentioned above, controller 144 is configured to average the signals from the sensor cluster to determine a thickness of the wafer. In one embodiment, a plurality of sensors are included in each top sensor array 242a and bottom sensor array 242b. Thus, as wafer 138 is spinning for the alignment process, the sensor arrays can map the thickness profile of the wafer through the sensor clusters included in the sensor arrays. In one embodiment, controller 144 is a computer which controls the process operation which wafer 138 is being delivered to. Here, the computer can store the thickness profile and adjust a recipe for the processing operation when wafer 138 is undergoing the processing operation. That is, the sensor clusters of the sensor array, when placed in the front end of the processing system allows for the customization for each wafer as it is processed. For example, the process variables for a CMP recipe, such as pressure, belt speed, etc., can be adjusted for a particular wafer. In other words, each process operation can be customized for a particular wafer. One skilled in the art will appreciate that controller 144 can be in communication with another controller or computer controlling the process operation and provide the thickness profile to the other controller or computer.

Figure 15:
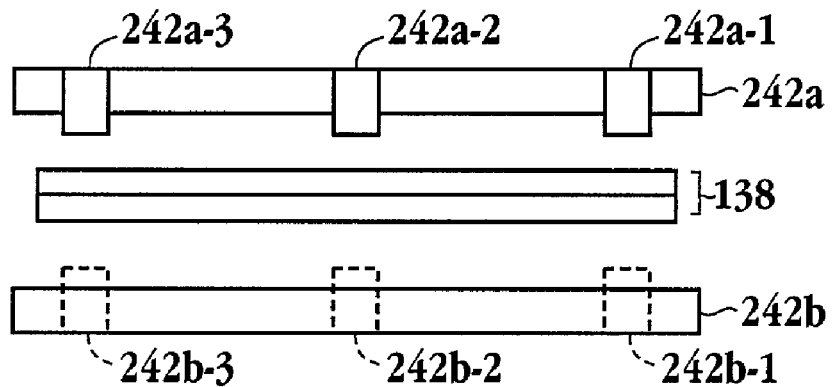
FIG. 15 is a more detailed side view of the sensor array containing a plurality of sensor clusters in accordance with one embodiment of the invention.

FIG. 15 is a more detailed side view of the sensor array containing a plurality of sensor clusters in accordance with one embodiment of the invention. Here, top sensor array 242a includes top sensors 242a-1, 242a-2 and 242a-3. Bottom sensor array 242b includes bottom sensors 242b-1, 242b-2, and 242b-3. In one embodiment each of the sensors are eddy current sensors. In the embodiment of FIG. 15, top eddy current sensors are offset from corresponding bottom eddy current sensors of a clustered set of sensors. However, as mentioned above, the top and bottom eddy current sensors can share a common axis by applying a phase shift between the top and the bottom sensors or using a different frequency.

Figure 16:
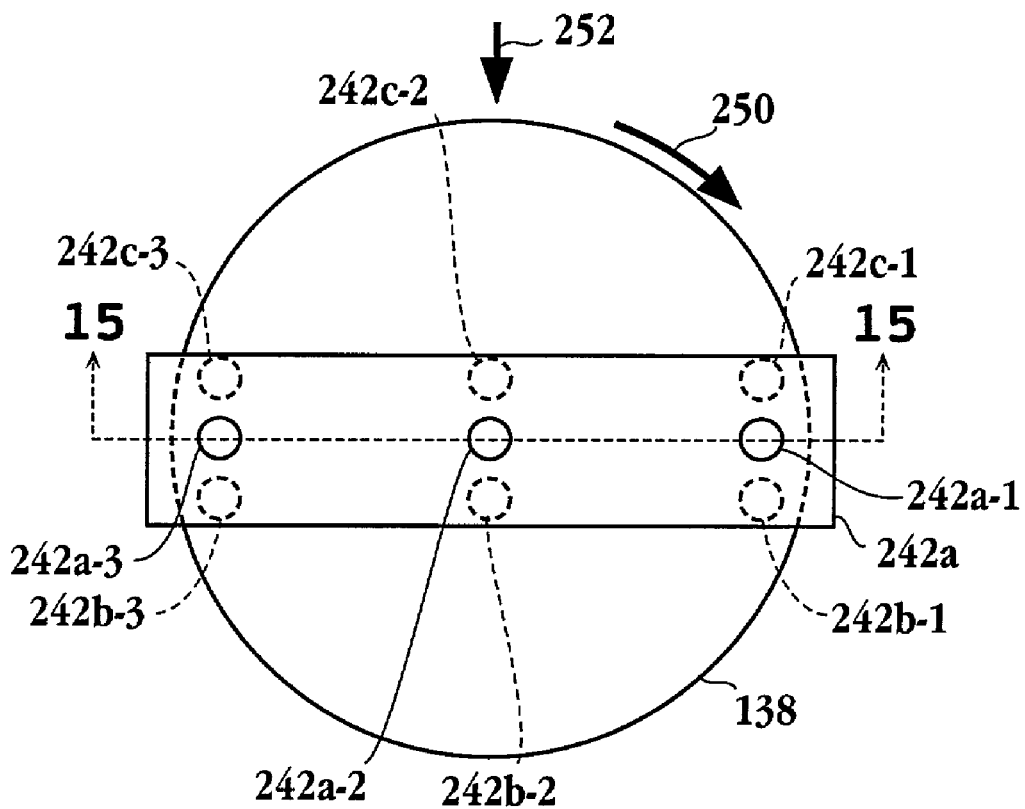
FIG. 16 is a top view of the sensor array containing a plurality of clustered sensors of FIG. 15 in accordance with one embodiment of the invention.

FIG. 16 is a top view of the sensor array containing a plurality of clustered sensors of FIG. 15 in accordance with one embodiment of the invention. Here it can be seen that top sensor array 242a includes top sensor 242a-1–242a-3. Bottom sensor array 242b includes bottom sensors 242b-1–242b-3 and 242c-1–242c-3. Thus, the sensor clusters of the sensor array are configured as described with reference to FIGS. 6B and 7B. As wafer 138 rotates in the aligner in the direction of arrow 250, the sensors generate a thickness profile of wafer 138 by detecting signals indicative of the thickness. Additionally, the sensors can monitor the thickness of the wafers as the wafer is moving linearly, in the direction of arrow 252, as the wafer is brought into the aligner. It should be appreciated that the sensor array can have any number of sensor clusters in any suitable pattern to map the thickness profile. Additionally, the sensors do not have to be evenly placed over the wafer. In one embodiment, the non-symmetrical placement of the corresponding top and bottom sensors, i.e., sensor clusters may provide a more detailed map of the thickness profile of wafer 138.

In summary, the present invention provides for the determination of an endpoint of a semiconductor fabrication process, such as a CMP process, through a clustered sensor configuration. The clustered sensors allow for the determination of the endpoint and associated removal or deposition rates by initially determining a thickness of a film on the wafer under non-process conditions. In one embodiment, the thickness of the film being measured is between about 0 microns and 2 microns. The determined thickness is provided to a second sensor associated with the process operation in order to calibrate the sensor so that variables from processing conditions that cause error in the thickness measurement are substantially eliminated. It should be appreciated that while the embodiments have been described in terms of a CMP process, the clustered sensors or arrays containing clustered sensors are not limited to a CMP process. For example, the sensors can be used within any semiconductor process that removes or deposits a layer or film on a substrate, such as etch, deposition and photoresist stripping processes.

In addition, the present invention allows for mapping a thickness profile of a wafer so that a process operation can use the information to optimize the process variables for the incoming wafer thickness. One skilled in the art will appreciate that the thickness of the wafer can also be monitored upon the completion of the processing operation. For example, after the illustrative CMP operations used above, the thickness of the wafer can be monitored as the wafer is brought back to a load module. The post-process monitoring can be used to provide feedback to further optimize the processing parameters. Alternatively, the post-process monitoring can be used for the next process the wafer is exposed to where the thickness profile of the wafer is helpful information.

Moreover, the eddy current sensor clusters were described as being integrated with aligners in one embodiment of the invention. It should be appreciated that any tool generating full or partial wafer rotation can be effective for generating a thickness profile in conjunction with the sensor clusters. In addition, the sensor clusters can be employed along the wafer path, such that the robot passes the wafer between the sensor cluster or array of sensor clusters. In turn, the thickness profile is detected from the linear radial motion of the wafer between the sensor clusters. Thus, the measurements are performed on the fly at typical robotics loading/unloading velocity. That is, system throughput is not impacted.

The invention has been described herein in terms of several exemplary embodiments. Other embodiments of the invention will be apparent to those skilled in the art from consideration of the specification and practice of the invention. The embodiments and preferred features described above should be considered exemplary, with the invention being defined by the appended claims.

What is claimed is:

1. A wafer aligner, comprising:
   a rotating support configured to support a semiconductor substrate; and
   a sensor cluster configured to detect a signal indicating a metal film thickness of the semiconductor substrate, the sensor cluster consists of single type sensors located at both sides of the semiconductor substrate, wherein the single type sensors include both a current inducing element and a current sensing element; and the sensor cluster configured to be substantially insensitive to a distance of the semiconductor substrate to the single type sensors located above and below the semiconductor substrate without assistance from another type of sensor.

2. The wafer aligner of claim 1, wherein the sensor cluster consists of eddy current sensors.

3. The wafer aligner of claim 1, wherein the sensor cluster is in communication with a controller.

4. The wafer aligner of claim 2, wherein the eddy current sensors include one top sensor being offset from each vertical axis of two bottom sensors.

5. The wafer aligner of claim 1, wherein the metal film thickness is communicated to optimize process variables of a chemical mechanical planarization (CMP) recipe.

6. A system for processing a semiconductor substrate, comprising:
   a load port configured to hold a semiconductor substrate;
   a robot arm configured to transport the semiconductor substrate;
   an aligner configured to receive the semiconductor substrate from the robot arm, the aligner including;
   a sensor cluster configured to detect a signal indicating a metal film thickness of the semiconductor substrate to generate a thickness profile of the semiconductor substrate, the sensor cluster consists of single type sensors located at opposing sides of the semiconductor substrate, the single type sensors including both a current inducing element and a current sensing element, the sensor cluster including one top sensor being offset from a vertical axis of one bottom sensor, the sensor cluster configured to be substantially insensitive to a distance of the semiconductor substrate to the single type sensors located at the opposing sides of the semiconductor substrate without assistance from another type of sensor;
   a controller in communication with the sensor cluster, the controller configured to receive the thickness profile; and
   a process tool sensor in communication with the sensor cluster through the controller, the process tool sensor configured to receive the thickness profile from the controller to calibrate the process tool sensor, wherein a recipe for a processing operation performed by a process tool containing the process tool sensor is configured to be modified in response to the thickness profile being received by the process tool sensor.

7. The system of claim 6, wherein the sensors of the sensor cluster and the process tool sensor are eddy current sensors.

8. The system of claim 6, wherein the process tool is a chemical mechanical planarization (CMP) tool.

9. The system of claim 8, wherein the process tool sensor is located within a wafer carrier.

10. The wafer aligner of claim 1, wherein the sensor cluster becomes substantially insensitive to distance by averaging a signal from a sensor above a first side of the semiconductor substrate with a signal from a sensor above a second side of the semiconductor substrate.

11. The system of claim 6, wherein the sensor cluster becomes substantially insensitive to distance by averaging a signal from a sensor above a first side of the semiconductor substrate with a signal from a sensor above a second side of the semiconductor substrate.

* * * * *